United States Patent
Heo et al.

[11] Patent Number: 5,854,599
[45] Date of Patent: Dec. 29, 1998

[54] DIGITAL-TO-ANALOG CONVERSION WITH REDUCED QUANTIZATION NOISE

[75] Inventors: Jung-Kwon Heo, Seoul; Tae-Hee Lee, Suwon, both of Rep. of Korea

[73] Assignee: Samsung Electronics Co., Ltd., Kyungki-do, Rep. of Korea

[21] Appl. No.: 927,533

[22] Filed: Sep. 11, 1997

[30] Foreign Application Priority Data

Sep. 11, 1996 [KR] Rep. of Korea .................. 96-39336

[51] Int. Cl.⁶ .................................................. H03M 3/02
[52] U.S. Cl. ........................................ 341/143; 341/144
[58] Field of Search .................................. 341/143, 144, 341/118, 436; 364/724.01, 724.1

[56] References Cited

U.S. PATENT DOCUMENTS

| | | | |
|---|---|---|---|
| 4,682,251 | 7/1987 | Hirota et al. | 360/33.1 |
| 4,746,902 | 5/1988 | Tol et al. | 340/347 |
| 5,177,600 | 1/1993 | Monta et al. | 358/37 |
| 5,323,157 | 6/1994 | Ledzius et al. | 341/143 |
| 5,663,771 | 9/1997 | Raby | 348/663 |
| 5,724,038 | 3/1998 | Koifman et al. | 341/144 |
| 5,757,300 | 5/1998 | Koilpillai et al. | 341/143 |

FOREIGN PATENT DOCUMENTS 2 298 096  8/1996  United Kingdom ............ H03M 3/00

OTHER PUBLICATIONS

UK Search Report.

*Primary Examiner*—Brian K. Young
*Assistant Examiner*—Peguy Jean Pierre
*Attorney, Agent, or Firm*—Sughrue, Mion, Zinn, Macpeak & Seas, PLLC

[57] ABSTRACT

A digital-to-analog (D/A) conversion apparatus using a delta-sigma method performs an additional gain control operation in addition to a filtering operation with respect to differential data in a conventional D/A conversion apparatus. The D/A conversion apparatus includes a multiplier for multiplying the differential data output from a differentiator contained in a conventional D/A conversion apparatus and outputting the resultant data, a filter for filtering the differential data and outputting the filtered data and an adder for adding the output data of the multiplier and the filter and supplying the added result to a quantizer. The factor used in the multiplier is properly selected so that smaller quantization noise is generated than that added during quantization in the conventional D/A conversion apparatus. Thus, the D/A conversion apparatus can provide a wider signal passband in comparison to the conventional D/A conversion apparatus, since it generates the relatively smaller quantization noise with respect to the entire passband. As a result, the D/A conversion apparatus provides good performance appropriate for a next-generation audio equipment requiring a higher signal-to-noise ratio. Also, since the D/A conversion apparatus can be realized by modifying the conventional D/A conversion apparatus slightly in hardware, a D/A conversion apparatus having much better performance can be manufactured using a substantially same production cost and process.

7 Claims, 5 Drawing Sheets

DIGITAL-TO-ANALOG CONVERSION WITH REDUCED QUANTIZATION NOISE

BACKGROUND OF THE INVENTION

The present invention relates to a digital-to-analog (D/A) conversion apparatus, and more particularly, to a D/A conversion apparatus in which quantization noise imposed on a signal is reduced in order to improve the performance of the apparatus.

Various analog-to-digital (A/D) conversion technologies for converting an analog signal into a digital signal and various D/A conversion technologies for converting a digital signal into an analog signal, are under development in the field of analog and digital communication systems. Among them, one technology which is widely used in an audio signal band is a delta-sigma method using an oversampling technique. The delta-sigma method uses a low-pass filter (LPF) having a constant bandwidth to thereby limit a frequency band of an input signal, and oversamples the band-limited signal with a sampling frequency more than a Nyquist frequency. A conventional D/A conversion apparatus using such a delta-sigma method is described below with reference to FIG. 1.

In FIG. 1, a 16-bit digital signal where each sample is expressed as 16 quantization bits is input to an interpolator 11. The interpolator 11 interpolates the input digital signal and outputs a digital signal oversampled by a desired multiple. A differentiator 12 receives the oversampled digital data x and data y supplied from a delay 18. The differentiator 12 changes the received data y into a digital signal expressed as 16 bits, and then obtains differential data x−y between the oversampled digital data x and the digital data as expressed by 16 bits. The differential data x−y is input to a LPF 13. The LPF 13 having a transfer function expressed as H(f) low-pass-filters the differential data x−y.

A quantizer 14 uses an oversampling technique which uses a much higher frequency than the Nyquist frequency as a sampling frequency fs, in order to quantize the data (x−y)H(f) low-pass-filtered by the LPF 13 into a quantization bit of a single bit. The quantizer 14 includes a multiplier 15 and a sampler 16 and quantizes the data supplied from the LPF 13 to thereby output it in the form of a 1-bit bitstream. The multiplier 15 multiplies the low-pass-filtered data (x−y)H(f) by a predetermined value g. The sampler 16 uses the sampling frequency fs to sample the data (x−y)H(f) output from the multiplier 15, to thereby generate 1-bit data expressed as a 1-bit quantization bit. As a result, the 1-bit data y is output in the form of a 1-bit bitstream from the quantizer 14. The 1-bit data y is input to a delay 18 and a D/A converter 17. The delay 18 delays the 1-bit data y supplied from the quantizer 14 by a predetermined time and supplies the delayed data to the differentiator 12. The D/A converter 17 which is a 1-bit digital-to-analog converter, converts the 1-bit bitstream output from the quantizer 14 into an analog signal to then be output.

Although the D/A conversion apparatus of FIG. 1 adopts an oversampling technique which uses a frequency much higher than the Nyquist frequency as a sampling frequency fs, the 1-bit bitstream output from the sampler 16 still contains quantization noise q which is added during quantization process. For analyzing such quantization noise q, a transfer function of the D/A conversion apparatus of FIG. 1 is expressed as the following equation (1) with respect to the 1-bit data y generated by the quantizer 14.

$$y = (x-y)H(f)g + q \quad \ldots (1)$$

The above equation (1) is expressed as the following equation (2) if the above equation is arranged with respect to the 1-bit data y.

$$y = H(f) \frac{g}{1+H(f)g} x + \frac{1}{1+H(f)g} q \quad (2)$$

Here, H(f) is a transfer function of the LPF 13.

If H(f)g is sufficiently larger than '1', the quantization noise generated during quantization process can be expressed as the following equation (3).

$$\frac{1}{1+H(f)g} q \quad (3)$$

The quantization noise expressed as the equation (3) is inversely proportional to the transfer function H(f) of the LPF 13. That is, as shown in the graph of FIG. 2, the quantization noise q becomes larger as the frequency grows higher. Particularly, in the case when the factor g of the multiplier 15 is constant, the quantization noise expressed as the equation (3) is determined by the transfer function H(f) of the LPF 13. Therefore, the higher the frequency, the smaller the magnitude of the H(f), to thereby increase the quantization noise.

If H(f) is '1', the quantization noise is minimized, which can be expressed as the following equation (4).

$$\frac{1}{1+g} q \quad (4)$$

However, as the frequency becomes higher, the magnitude of the quantization noise becomes larger, while the magnitude of the signal becomes smaller. As a result, a high frequency signal is stained with the quantization noise, which causes a band through which an input digital signal is converted into an analog signal to be narrower.

Moreover, audio equipment requiring a sampling frequency higher than the current sampling frequency, for example, a next-generation audio equipment of a super-audio concept having about 100 KHz bandwidth at maximum, requires a signal-to-noise ratio (SNR) higher than the current SNR. Therefore, in the case when the above-described D/A conversion apparatus is used in the above audio equipment, the above quantization noise problem becomes much severer.

SUMMARY OF THE INVENTION

To solve the above problems, it is an object of the present invention to provide a digital-to-analog (D/A) conversion apparatus in which quantization noise generated at the time when an input digital signal is converted into an analog signal is reduced to thereby improve digital-to-analog conversion performance.

To accomplish the above object of the present invention, there is provided a D/A conversion apparatus comprising: a differentiator for receiving data which is quantized as a predetermined, plurality of quantization bits and oversampled, and 1-bit data, and generating differential data between both the received data; filter means for band-pass-filtering the differential data generated by the differentiator and outputting the filtered data; a first multiplier for multiplying the differential data generated by the differentiator by a first factor and outputting the resultant data; an adder for adding the output data of the filter means and that of the first multiplier and outputting the resultant data; a quantizer for quantizing the output data of the adder into 1-bit data expressed as a 1-bit quantization bit and outputting the result; a delay for delaying the 1-bit data output from the quantizer by a predetermined interval of time and supplying the delayed 1-bit data to the differentiator; and a DA converter for digital-to-analog-converting a 1-bit bitstream composed of the 1-bit data output from the quantizer.

The first factor of the first multiplier has a magnitude which satisfies a condition for generating quantization noise relatively smaller than that when the quantizer quantizes only the output data of the filter means.

BRIEF DESCRIPTION OF THE DRAWINGS preferred embodiment is described with reference to the drawings, wherein.

DETAILED DESCRIPTION OF THE INVENTION

A preferred embodiment of the present invention will be described with reference to the accompanying drawings.

Figure 3:
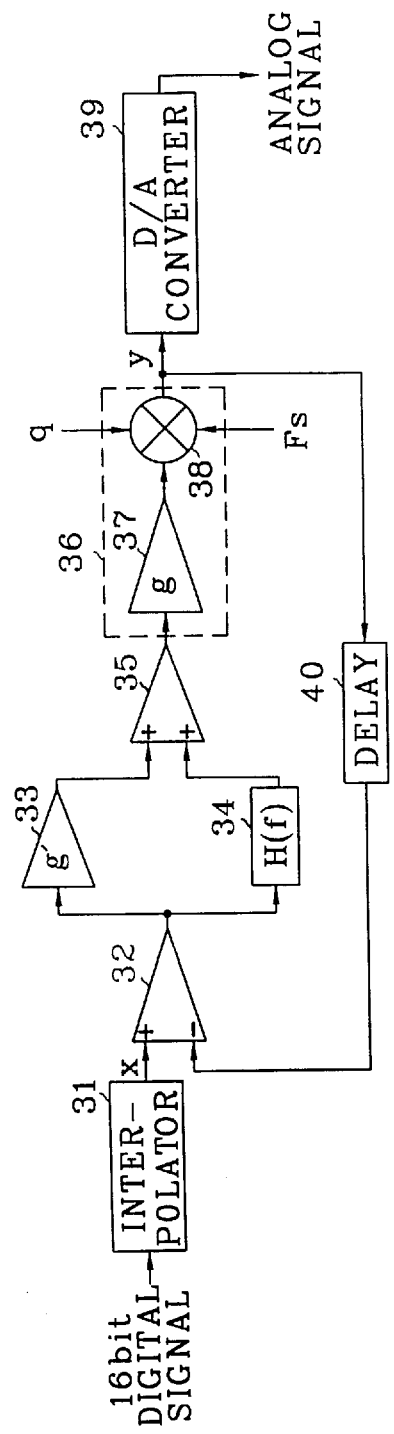
FIG. 3 is a block diagram of a D/A conversion apparatus according to a preferred embodiment of the present invention.

Referring to FIG. 3 showing a D/A conversion apparatus according to a preferred embodiment of the present invention, an interpolator 31 interpolates an input 16-bit digital signal and outputs a digital data x oversampled by a desired multiple. Here, the 16-bit digital signal is a signal where each sample is expressed as 16 quantization bits, as described referring to FIG. 1. The oversampled digital data x generated by the interpolator 31 is input to a differentiator 32. The differentiator 32 which performs the same operation as that of the FIG. 1 differentiator 12, obtains differential data x−y between the oversampled digital data x and the 1-bit data y fedback from a delay 40, and outputs the differential data x−y to a multiplier 33 and a filter 34. The multiplier 33 multiplies the input differential data x−y by a predetermined factor g' and outputs the resultant data (x−y)g' to an adder 35. A filter 34 which is implemented as a low-pass filter (LPF) or high-pass filter (HPF) having a constant bandwidth expressed as a transfer function H(f), filters the input differential data x−y and generates band-limited data (x−y)H(f). The band-limited data is input to the adder 35.

The adder 35 adds the data (x−y)g' supplied from the multiplier 33 and the band-limited data (x−y)H(f) supplied from the filter 34, and outputs the result to a quantizer 36. The quantizer 36 receiving the data output from the adder 36 includes a multiplier 37 and a sampler 38. The quantizer 36 uses an oversampling technique which uses a much higher frequency than the Nyquist frequency as a sampling frequency Fs, and quantizes the data supplied from the adder 35 into 1-bit data expressed as a 1-bit quantization bit. In more detail, the multiplier 37 multiplies the data (x−y)g'+(x−y)H (f) output from the adder 35 by a predetermined value g and outputs the multiplication result to the sampler 38. The sampler 38 samples the data [(x−y)g'+(x−y)H(f)]g output from the multiplier 37 using the sampling frequency Fs, and generates 1-bit data y. As a result, the 1-bit data y is output in the form of a 1-bit bitstream from the quantizer 36. A D/A converter 39 converts the 1-bit bitstream output from the quantizer 14 into an analog signal to then be output. A delay 40 delays the 1-bit data y supplied from the quantizer 36 by a predetermined time and supplies the delayed result to the differentiator 32 as a feedback. Here, the above predetermined time is for obtaining the differential data between the adjacent oversampled data. The differentiator 32 converts the 1-bit data supplied from the delay 40 into 16-bit data, and then, calculates differential data between the converted 16-bit data and the 16-bit data supplied from the interpolator 31.

A difference between the D/A conversion apparatuses of FIG. 3 and FIG. 1, will be described below, in relation to the quantization noise.

The D/A conversion apparatus of FIG. 3 has a transfer function which is expressed as the following equation (5) with respect to the 1-bit data y generated by the quantizer 36.

$$y = ((x-y)H(f) + (x-y)g')g + q \qquad \ldots (5)$$

The above equation (5) is expressed as the following equation (6) if the above equation is arranged with respect to the 1-bit data y.

$$y = \frac{(g' + H(f))g}{1 + (g' + H(f))g} x + \frac{1}{1 + (g' + H(f))g} q \qquad (6)$$

Here, H(f) is a transfer function of the filter 34.

If (g'+H(f))g is sufficiently larger than '1', the quantization noise generated during quantization can be expressed as th following equation (7).

$$\frac{1}{1 + (g' + H(f))g} q \qquad (7)$$

Figure 4A:
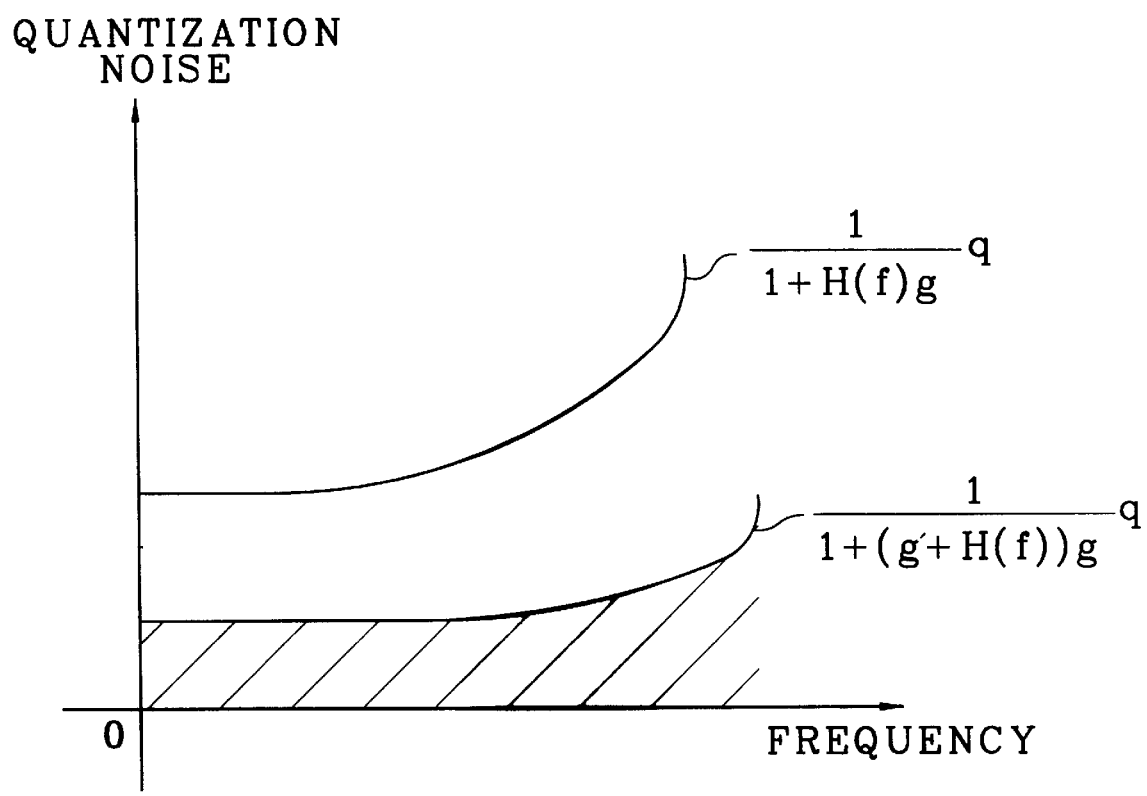
FIG. 4A is a graphical view showing a characteristic curve of frequency vs quantization noise when a filter in the FIG. 3 apparatus is implemented as a low-pass filter.

When the filter 34 is a LPF, the quantization noise expressed as the equation (7) satisfies the frequency-quantization noise characteristic curve which is positioned at the relatively lower side of FIG. 4A. If a transfer function H(f) of the filter 34 and the factor g' of the multiplier 33 are '1', respectively, the quantization noise of the equation (7) is minimized, which can be expressed as the following equation (8).

$$\frac{1}{1 + 2g} q \qquad (8)$$

Figure 1:
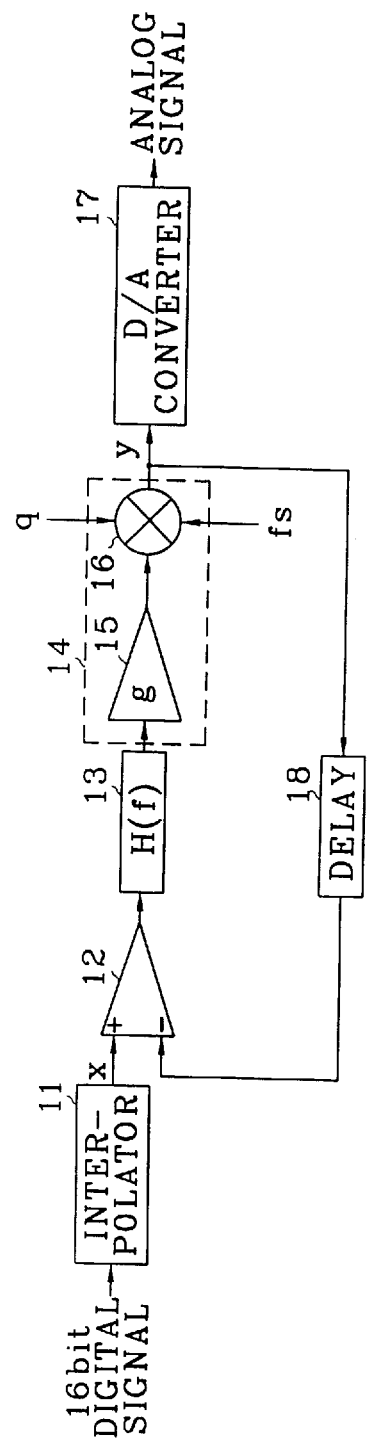
FIG. 1 is a block diagram of a convectional D/A conversion apparatus.
Figure 2:
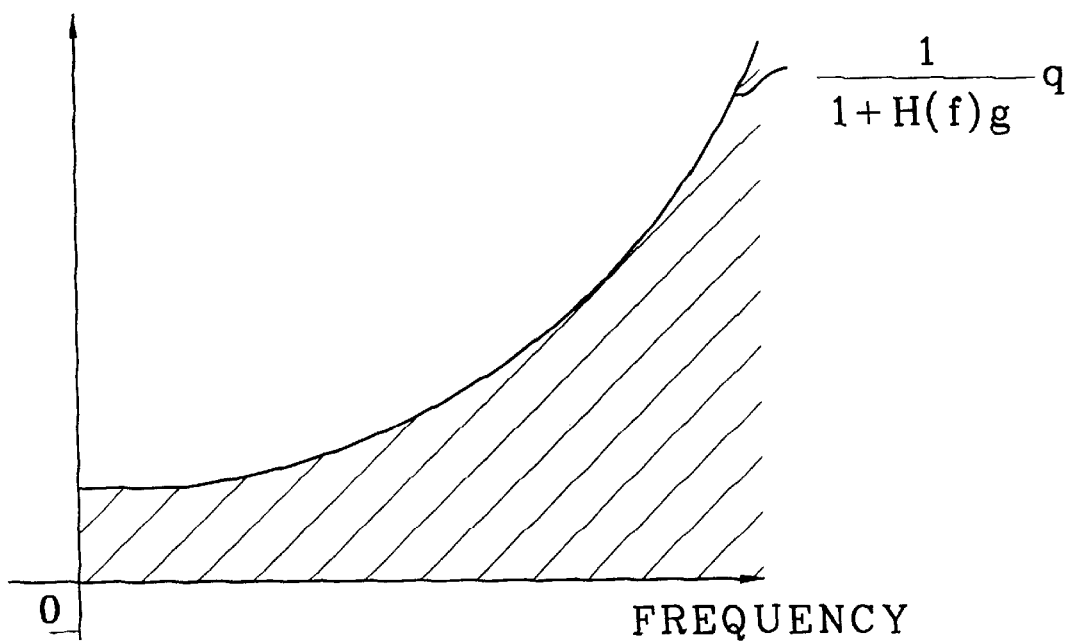
FIG. 2 is a graphical view showing a characteristic curve of frequency vs quantization noise in the apparatus as shown in FIG. 1.

Thus, the FIG. 3 apparatus has relatively smaller quantization noise, in comparison with the FIG. 1 D/A conversion apparatus using the LPF having the same transfer function H(f). In FIG. 4A, the frequency-quantization noise characteristic curve which is positioned at the relatively upper side is a characteristic curve of a conventional FIG. 1 apparatus. If the factor g' of the multiplier 33 becomes larger than '1', the quantization noise becomes much smaller. In addition, since an increasing rate of the quantization noise is lower than the conventional FIG. 1 apparatus, a passband having small quantization noise can be determined more widely than the conventional case.

Figure 4B:
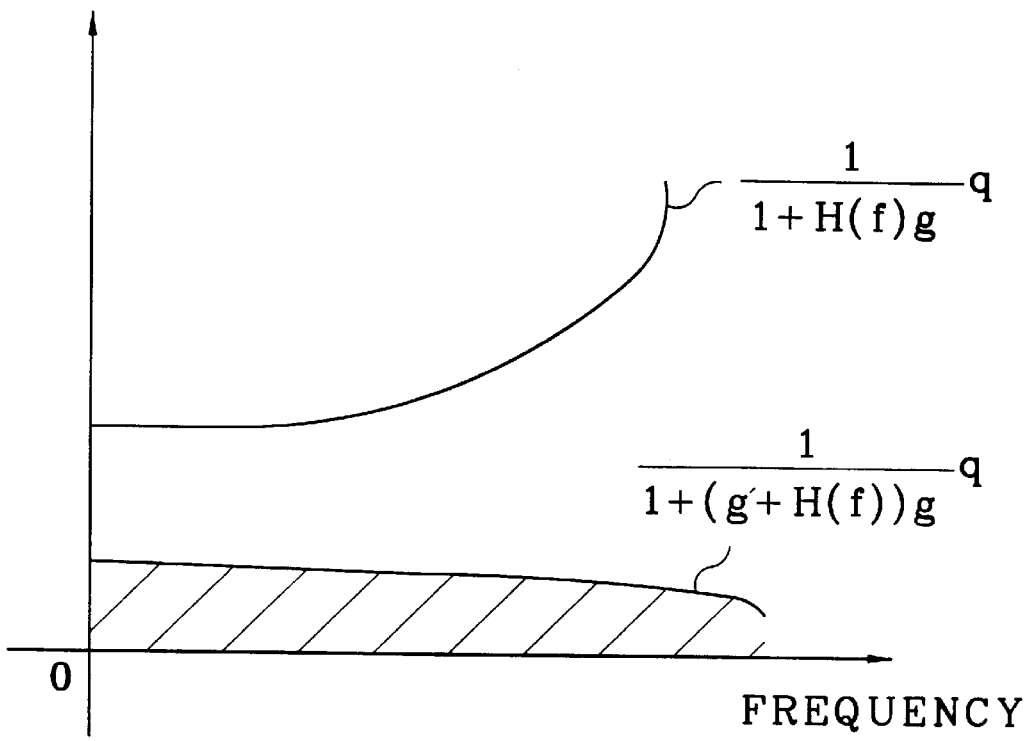
FIG. 4B is a graphical view showing a characteristic curve of frequency vs quantization noise when the filter in the FIG. 3 apparatus is implemented as a high-pass filter.

When the filter 34 is a HPF, the quantization noise expressed as the equation (7) satisfies the frequency-quantization noise characteristic curve which is positioned at the relatively lower side of FIG. 4B. Therefore, the FIG. 3 apparatus has relatively smaller quantization noise in comparison to the D/A conversion apparatus of FIG. 1. That is, as the band of the input signal goes to the high frequency region, the transfer function H(f) of the filter 34 increases and thus the quantization noise becomes smaller. Also, when both factors g' and g of the multipliers 33 and 37 are constant, the quantization noise is decided by the transfer function H(f) of the filter 34. Therefore, as the frequency gets higher, the magnitude of the H(f) becomes larger and thus the quantization noise is reduced. If a transfer function H(f) of the filter 34 has the minimum value '0' and the factor g' of the multiplier 33 is '1', the quantization noise is maximized and expressed as the same one as the equation (4), which is same as the minimum of the quantization noise of the D/A conversion apparatus of FIG. 1. Also, if the factor g' of the multiplier 33 becomes larger than '1', the quantization noise can be expressed as the following equation (9), which becomes much smaller.

$$\frac{1}{1+g'g} q \quad (9)$$

Thus, the FIG. 3 apparatus using the HPF has smaller quantization noise in comparison with the FIG. 1 D/A conversion apparatus in the entire frequency domain as shown in FIG. 4B.

As described above, the D/A conversion apparatus according to the present invention performs a filtering operation using a LPF or HPF and a magnitude control operation separately with respect to differential data between both adjacent oversampled data, and adds the magnitude-controlled data and the filtered data to quantize the added result. Thus, the present invention can reduce quantization noise with respect to the entire frequency domain and has an effect of widening the width of the passband. As a result, the present invention provides a performance appropriate for the next-generation audio equipment requiring a higher SNR. Also, since the D/A conversion apparatus according to the present invention can be realized by modifying the conventional D/A conversion apparatus slightly in hardware, a D/A conversion apparatus having much better performance can be manufactured using a substantially same production cost and process.

While only certain embodiment of the invention have been specifically described herein, it will apparent that numerous modifications may be made thereto without departing from the spirit and scope of the invention.

What is claimed is:

1. A digital-to-analog (D/A) conversion apparatus comprising:

a differentiator for receiving data which is quantized as a predetermined, plurality of quantization bits and oversampled, and 1-bit data, and generating differential data between both the received data;

filter means for band-pass-filtering the differential data generated by said differentiator and outputting the filtered data;

a first multiplier for multiplying the differential data generated by said differentiator by a first factor and outputting the resultant data;

an adder for adding the data output from said filter means and the data output from said first multiplier and outputting the resultant data;

a quantizer for quantizing the data output from said adder into 1-bit data expressed as a 1-bit quantization bit and outputting the result;

a delay for delaying the 1-bit data output from said quantizer by a predetermined interval of time and supplying the delayed 1-bit data to said differentiator; and a DA converter for digital-to-analog-converting a 1-bit bitstream composed of the 1-bit data output from said quantizer.

2. The D/A conversion apparatus according to claim 1, wherein the first factor of the first multiplier has a magnitude which satisfies a condition for generating quantization noise relatively smaller than that when the quantizer quantizes only the output data of the filter means.

3. The D/A conversion apparatus according to claim 2, wherein said quantizer comprises a second multiplier for multiplying the data output from said adder by a second factor and outputting the resultant data; and a sampler for oversampling the data output from said second multiplier and generating 1-bit data, wherein said first multiplier, said second multiplier and said filter means are designed so that a quantization noise added by the quantization operation in said quantizer satisfy the following equation:

$$\text{quantization noise} = \frac{1}{1 + (g' + H(f))g} q$$

in which (g'+H(f))g is sufficiently larger than '1', wherein g' is the first factor, g is the second factor and H(f) is a transfer function of said filter means.

4. The D/A conversion apparatus according to claim 3, wherein said filter means is a low-pass filter and said first factor has a magnitude of '1' at least.

5. The D/A conversion apparatus according to claim 4, wherein said filter means and said first multiplier are designed so that the maximum value of the transfer function H(f) of said filter means and the minimum value of the first factor are '1', respectively, in order to limit the minimized magntude of the added quantization noise to $$\frac{1}{1+2g} q.$$

6. The D/A conversion apparatus according to claim 3, wherein said filter means is a high-pass filter and said first factor has a magnitude of '1' at least.

7. The D/A conversion apparatus according to claim 6, wherein said filter means and said first multiplier are designed so that the minimum value of the transfer function H(f) of said filter means is '0' and the minimum value of the first factor is '1', in order to limit the maximized magnitude of the added quantization noise to $$\frac{1}{1+g} q.$$

* * * * *